US006677240B1

United States Patent
Tigelaar

(10) Patent No.: US 6,677,240 B1
(45) Date of Patent: Jan. 13, 2004

(54) METHOD FOR PATTERNING DENSE AND ISOLATED FEATURES ON SEMICONDUCTOR DEVICES

(75) Inventor: Howard L. Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/186,033

(22) Filed: Jun. 28, 2002

(51) Int. Cl.[7] .............................................. H01L 21/311
(52) U.S. Cl. ........................ 438/700; 438/734; 438/736
(58) Field of Search ................................. 438/700, 717, 438/720, 723, 724, 725, 734, 736, 742, 743, 744, 618, 637, 587

(56) References Cited

U.S. PATENT DOCUMENTS 6,150,256 A * 11/2000 Furukawa et al. .......... 438/618

* cited by examiner

Primary Examiner—Wael Fahmy
Assistant Examiner—Ginette Peralta
(74) Attorney, Agent, or Firm—Peter K. McLarty; W. James Brady, III; Frederick J. Telecky, Jr.

(57) ABSTRACT

According to one embodiment of the invention, a method of forming a semiconductor device is provided. The method includes providing a first mask that defines a densely populated plurality of hole patterns. The first mask overlies a layer of dielectric material. The method also includes defining at least one isolated hole pattern in the first mask by covering one or more of the defined densely populated hole patterns using a second mask. The method also includes forming a plurality of densely populated holes in the dielectric material and at least one isolated hole by etching, according to one or more of the plurality of hole patterns that are not covered by the second mask, the layer of dielectric material.

20 Claims, 3 Drawing Sheets

METHOD FOR PATTERNING DENSE AND ISOLATED FEATURES ON SEMICONDUCTOR DEVICES

TECHNICAL FIELD OF THE INVENTION

This invention relates generally to the field of electronic devices and more particularly to a method for patterning dense and isolated features on a semiconductor device.

BACKGROUND OF THE INVENTION

In an effort to further miniaturize semiconductor devices, there is a continuing drive to reduce the width of the holes and features on the silicon surface. As the width of the holes and features get smaller than the wavelength of the particular radiation source used in the patterning process, diffraction may cause patterning errors. To correct this problem, the process of Optical Proximity Correction is used. Optical Proximity Correction refers to adjusting patterns of the holes and/or features on the mask by the margin of error caused by the diffraction effect so that the actual pattern provided on the silicon surface is closer to the desired pattern. However, Optical Proximity Correction is inadequate where a mask defines a combination of densely populated holes/features and isolated holes/features. This is because Optical Proximity Correction cannot completely compensate for the differences in isolated and dense holes/features. So there remains an intolerable depth of focus variation between the dense and isolated holes/features. This problem is worsened as the holes/features are further miniaturized.

To overcome this problem, lithographers use two separate masks having critical patterns to pattern features on a single level—one mask having critical patterns of densely populated holes/features and the other mask having critical patterns of isolated holes/features. Although this technique alleviates the problem of focus depth variation between dense and isolated holes/features, it creates a separate problem for aligning the patterned level with other layers of the semiconductor device. For example, aligning contacts of the patterned level to the underlying level using the imprint of one mask as a reference creates an error in alignment of contacts formed according to the second mask.

SUMMARY OF THE INVENTION

According to one embodiment of the invention, a method of forming a semiconductor device is provided. The method includes providing a first mask that defines a densely populated plurality of hole patterns. The first mask overlies a layer of dielectric material. The method also includes defining at least one isolated hole pattern in the first mask by covering one or more of the defined densely populated hole patterns using a second mask. The method also includes forming a plurality of densely populated holes in the dielectric material and at least one isolated hole by etching, according to one or more of the plurality of hole patterns that are not covered by the second mask, the layer of dielectric material.

Some embodiments of the invention provide numerous technical advantages. Some embodiments may benefit from some, none, or all of these advantages. For example, according to one embodiment, the error caused by having two mask alignment references is eliminated by providing only one mask having a critical pattern. According to another embodiment, patterning of features is simplified because only one critical pattern is required rather than two. According to another embodiment, any transitional area between the dense and isolated groups of features is eliminated by presenting a uniform density on a single critical mask.

Other technical advantages may be readily ascertained by one of skill in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1A through 3D of the drawings, like numerals being used for like and corresponding parts of the various drawings.

Figure 1A:
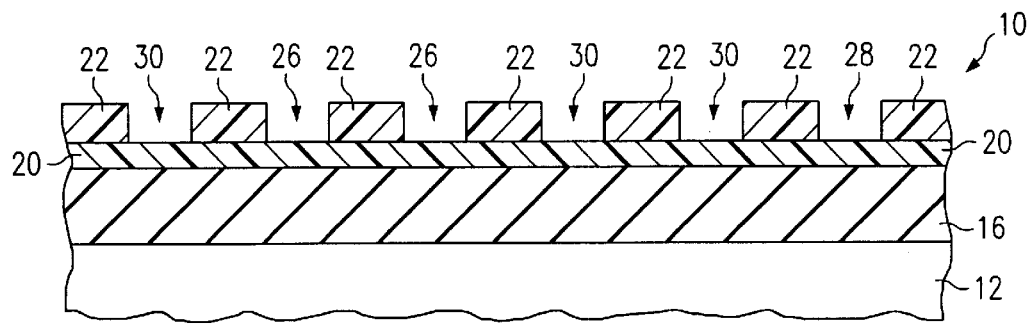
FIGS. 1A through 1D are a series of schematic cross-sectional diagrams illustrating one embodiment of a semiconductor device constructed according to one embodiment of the present invention.

FIGS. 1A through 1D illustrate cross-sections of a semiconductor device 10 after certain processing acts for patterning and etching holes have been performed. Referring to FIG. 1A, semiconductor device 10 comprises a substrate 12 and a dielectric layer 16. An example of dielectric layer 16 is a layer of oxide. Dielectric layer 16 may be grown or deposited using any suitable methods, including oxidation and chemical vapor deposition. A hardmask layer 20 is provided on dielectric layer 16. Hard mask layer 20 may be formed from silicon nitride or other suitable material. A critical mask 22, formed from photo-resist material, is provided on hardmask layer 20; however, a mask may be any device used to cover and/or expose any layer of a semiconductor device to radiation, such as ultra-violet rays. For example, a mask may be coupled to the radiation source so that a shadow defining the patterns of the mask is cast on a particular layer of the semiconductor device. In another example, a mask, such as mask 22, may overlie a layer of semiconductor device 10. One example of hardmask layer 20 is a layer of nitride; however, other suitable material may be used.

A conventional method of printing densely populated holes and isolated holes on a single level requires the use of two or more masks, each having a set of critical patterns. A "critical pattern" refers to the pattern on a mask having a precision standard that is acceptable for a particular patterning process. A mask having a critical pattern is referred to as a "critical mask." A "precision standard" of a mask refers to the margin of error between the intended dimensions of the holes or features to be patterned and the actual dimensions of the holes or features that are defined by the mask. A less precise standard would have a larger margin of error.

In a case where two critical masks are used for patterning, the first mask may comprise a set of critical patterns defining densely populated holes. The second mask may comprise a set of critical patterns defining one or more isolated holes.

"Densely populated" refers to holes or features that are separated from each other by the minimum or near-minimum design rule. "Isolated" holes/features refers one or more holes/features that are separated from all neighboring hole/feature by a distance that is conventionally two or more times the minimum design rule distance. The conventional solution of printing a group of densely populated features using one critical pattern mask and isolated features using another critical mask requires the use of two different printing steps. One printing step is used for the densely populated holes/features and the other another one is used for the isolated holes/features. Implementing two critical patterning steps using two critical masks may create a problem because aligning metal to contacts formed using one critical mask as a reference creates an error in the alignment of metal to contacts formed using the second critical mask.

According to some embodiments of the present invention, a method is provided that allows the printing of dense and isolated holes/features using only one critical mask. This is advantageous in some embodiments of the invention because the error caused by having two or more critical mask alignment references is eliminated by providing only one mask having a set of critical patterns. According to another embodiment, patterning of holes/features is simplified because only one set of critical patterns is required rather than two or more. According to another embodiment, any transitional area between the dense and isolated groups of holes/features is eliminated by presenting a uniform density on a single critical mask.

Referring again to FIG. 1A, critical mask 22 comprises densely populated hole patterns, such as hole patterns 26, and isolated hole patterns, such as hole patterns 28, as a single set of critical patterns of densely populated hole patterns 26, 28 and 30. The space separating the isolated hole patterns from neighboring hole patterns is filled by "dummy" hole patterns, such as hole patterns 30. "Dummy" hole patterns 30 are hole patterns that will not be etched into dielectric layer 16. However, the insertion of "dummy" hole patterns 30 in critical mask 22 turns the entire critical mask 22 into a critical mask having densely populated hole patterns. Any number and combination of hole patterns, such as hole patterns 26, 28, and 30, may be defined as densely populated hole patterns by critical mask 22.

Figure 1B:
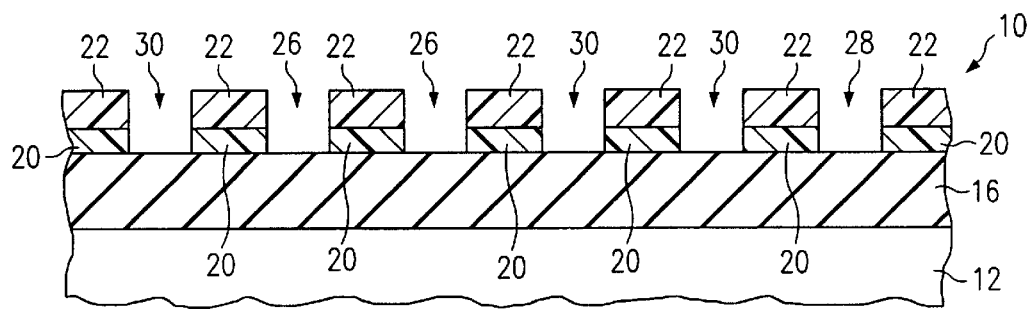
Figure 1C:
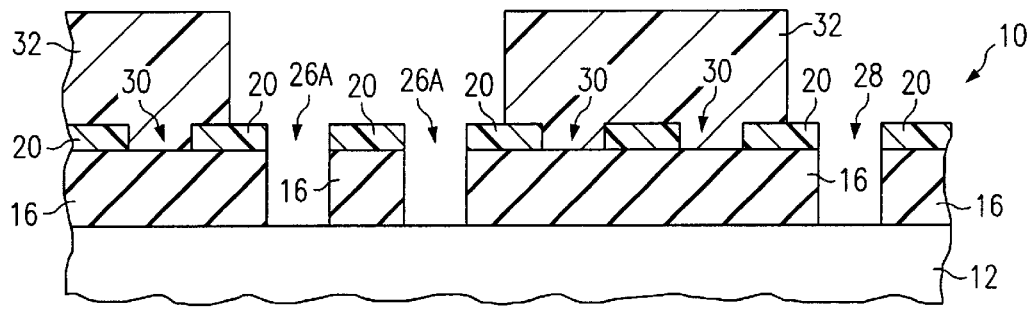

Referring to FIG. 1B, mask 22 is used to etch holes corresponding to hole patterns 26, 28, and 30 through hardmask layer 20. Etching may occur through any suitable process, including wet etching and plasma etching. After the etching, hardmask 20 becomes a mask that defines hole patterns 26, 28, and 30. Referring to FIG. 1C, dummy holes patterns 30 of hardmask layer 20 are covered by a mask 32 having non-critical patterns. Mask 32 has a precision standard that is less precise than that of mask 22 or hardmask 20. For example, the edges of mask 32 do not align precisely with the edges of each portion of hardmask 20, as shown in FIG. 1C. There is no need for such precision because the purpose of mask 32 is to merely cover unwanted hole patterns, such as dummy hole patterns 30. After mask 32 is used to cover dummy hole patterns 30, densely populated holes 26A and isolated hole 28A are etched in dielectric layer 16 according to hole patterns 26 and 28. Holes 26A and 28A may be etched using any suitable etching process, such as wet etching and plasma etching.

Figure 1D:
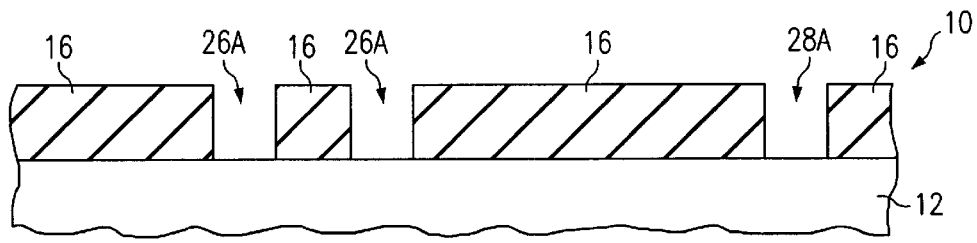

Referring to FIG. 1D, hardmask 20 and mask 32 are removed from dielectric layer 16 by using plasma etching or a chemical bath. An example of the chemical bath is a bath using $H_3PO_4$, if hardmask 20 is formed from silicon nitride, or $NH_4OH$, if hardmask 20 is formed from aluminum. The removal of hardmask 20 and mask 32 leaves only densely populated holes 26A and isolated hole 28A that are etched into dielectric layer 16.

Using only one critical mask 22 having all of the critical patterns is advantageous because it eliminates the error caused by multiple critical mask alignment references, in some embodiments of the invention. According to another embodiment, the process of patterning features is simplified because only one mask with critical patterns is required. According to another embodiment, any transitional area between the dense and isolated groups of holes is eliminated by presenting a uniform density on a single critical mask.

Figure 2A:
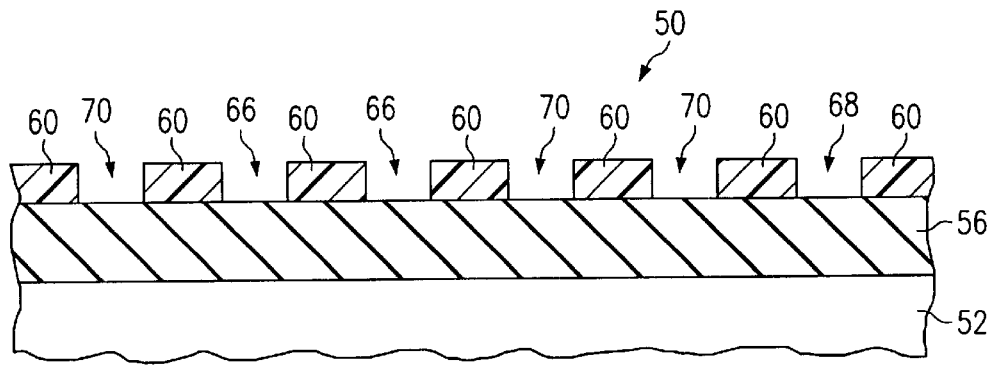
FIGS. 2A through 2C are a series of schematic cross-sectional diagrams illustrating another embodiment of a semiconductor device constructed according to one embodiment of the present invention.
Figure 2B:
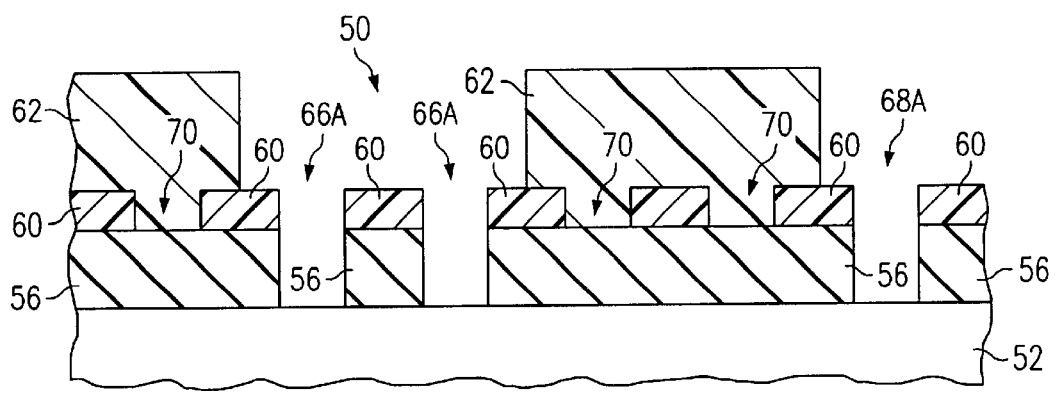
Figure 2C:
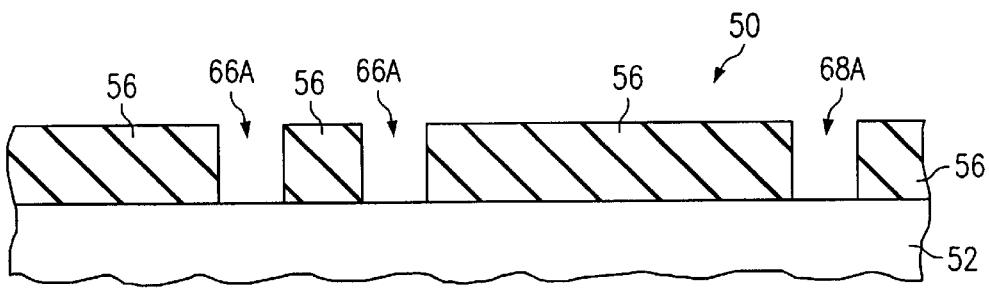

FIGS. 2A through 2C illustrate cross-sections of a semiconductor device 50 after certain processing acts for patterning and etching holes have been performed. Referring to FIG. 2A, semiconductor device 50 comprises a substrate 52 and a dielectric layer 56. Dielectric layer 56 may be grown or deposited using any suitable methods, including oxidation and chemical vapor deposition. A critical mask 60 is provided on dielectric layer 56 by coating dielectric layer 56 with an emulsion, such as photo-resist and exposing portions of the photo-resist using the appropriate light source/mask assembly. Then mask 60 is hardened using any suitable process, such as baking or exposure to deep ultraviolet light.

Like mask 22 shown in FIGS. 1A through 1C, mask 60 has both densely populated hole patterns and isolated hole patterns as a single set of densely populated critical hole patterns. Hole patterns 66 are desired hole patterns that are densely populated. Hole pattern 68 is a desired isolated hole pattern. Hole patterns 70 are "dummy" patterns that fill the space between hole patterns 66 and hole pattern 68.

Referring to FIG. 2B, dummy hole patterns 70 are covered by a mask 62 having a set of non-critical patterns. Thus, mask 62 has a precision standard that is less precise than that of mask 60. For example, as shown in FIG. 2B, the edges of mask 62 do not align precisely with the edges of each portion of mask 60. There is no need for such precision because the purpose of applying mask 62 is merely to cover the unwanted hole patterns, such as dummy hole patterns 70. After mask 62 is used to cover dummy hole patterns 70, holes 66A and 68A are etched into dielectric layer 56 using hole patterns 66 and 68. Etching may be performed using any suitable etching processes, such as wet etching or plasma etching.

Referring to FIG. 2C, mask 60 and mask 62 are removed from dielectric layer 56 using a suitable process, such as ashing or piranah wet strip. The removal of masks 60 and 62 leaves only densely populated holes 66A and isolated hole 68A that are etched into dielectric layer 56.

Figure 3A:
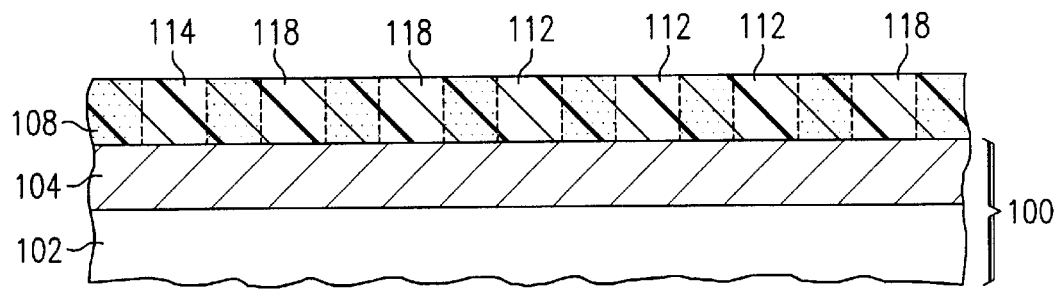
FIGS. 3A through 3D are a series of schematic cross-sectional diagrams illustrating another embodiment of a semiconductor device constructed according to one embodiment of the present invention.

FIGS. 3A through 3E illustrate cross-sections of a semiconductor device 100 after certain processing acts for patterning and etching features have been performed. Referring to FIG. 3A, semiconductor device 100 comprises a substrate 102 and a metal layer 104. A photo-resistant layer 108 is provided on metal layer 104. Photo-resistant layer 108 is exposed to a pattern of light that defines a plurality of features that are densely populated and one or more features that are isolated. The pattern of light may be provided using a light source, such as ultra-violet light source, and a critical mask having both densely populated feature patterns and isolated feature patterns as a single critical set of densely populated feature patterns. The light source and the mask are not explicitly shown. The exposure of photo-resistant layer 108 to a light pattern provided by a light source/mask assembly results in a series of feature patterns 112, 114, and 118 that are defined by the unexposed portions of photo-resistant layer 108. Feature patterns 112, 114 and 118 are distinguished from the exposed portions of photo-resistant layer 108 (shown as the dotted portion) by the dashed lines in FIGS. 3A and 3B.

Feature patterns 112 are densely populated feature patterns that are desired. Feature pattern 114 is an isolated feature pattern that is desired. Feature patterns 118 are dummy feature patterns that are used to fill the gaps between isolated feature patterns and densely populated feature patterns so that a single set of critical patterns may be provided on photo-resistant layer 108.

Figure 3B:
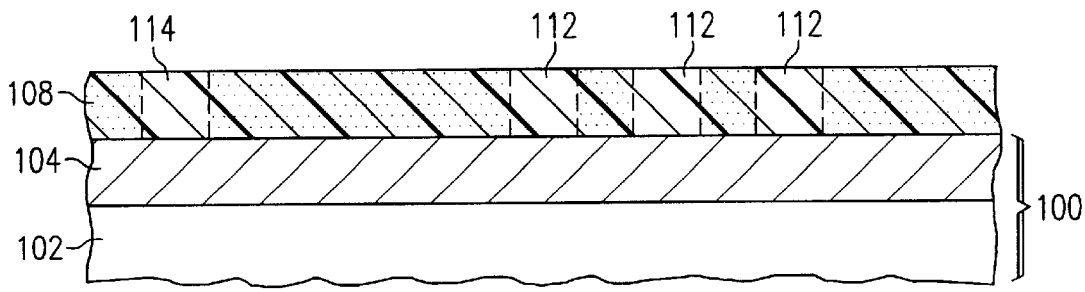

Referring to FIG. 3B, only dummy feature patterns 118 are exposed to the light source after providing patterns 112, 114, and 118 in photo-resistant layer 108. The selective exposure of dummy patterns 118 may be accomplished by using a second mask in conjunction with the light source. The second mask has a set of non-critical patterns, where the non-critical patterns operate to protect the desired feature patterns from exposure to light by casting a shadow on the desired feature patterns. The light source/second mask assembly is not explicitly shown. As shown in FIG. 3B, dummy feature patterns 118 become exposed portions of photo-resistant layer 108 (shown as the dotted portions) because the second mask did not protect these patterns 118.

Figure 3C:
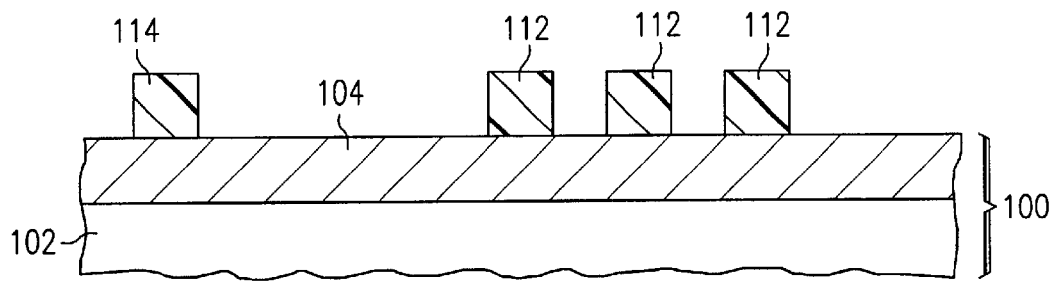
Figure 3D:
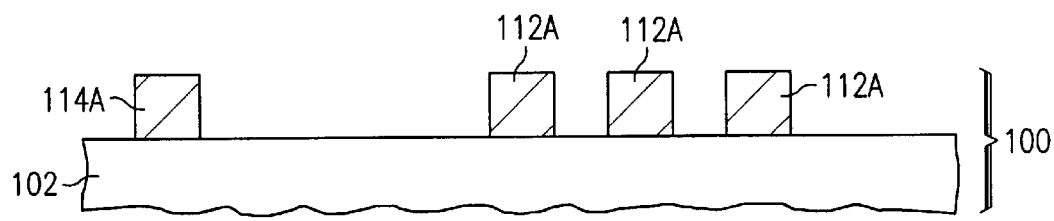

Referring to FIG. 3C, the exposed portions of photo-resistant layer 108 are removed during the photo develop process. FIG. 3C shows only the remaining portions of photo-resistant layer 108 that were not exposed to light. Then, according to the remaining portions of photo-resistant layer 108, metal layer 102 is etched to form densely populated features 112A and an isolated feature 114A. FIG. 3D shows the resulting features 112A and 114A.

Methods described in detail above allows the printing of dense and isolated features using one critical mask. This is advantageous because, according to one embodiment, the error caused by having two mask alignment references is eliminated by providing only one critical mask having a critical pattern. According to another embodiment, patterning of features is simplified because only one critical pattern is required rather than two. According to another embodiment, any transitional area between the dense and isolated groups of features is eliminated by presenting a uniform density on a single critical mask. Not all embodiments benefit from these advantages. Some embodiments of the invention benefit from some, none, or all of the advantages.

Although the present invention has been described in detail, it should be understood that various changes, substitutions, and alterations can be made hereto without departing from the spirit and scope of the invention as defined by the appended claims.

What is claimed is:

1. A method of forming a semiconductor device, comprising:
   providing a first mask that defines a densely populated plurality of hole patterns, the first mask overlying a layer of dielectric material;
   defining at least one isolated hole pattern in the first mask by covering one or more of the defined densely populated hole patterns using a second mask; and
   forming a plurality of densely populated holes in the dielectric material and at least one isolated hole by etching, according to one or more of the plurality of hole patterns that are not covered by the second mask, the layer of dielectric material.

2. The method of claim 1, wherein the first mask is formed from a photo-resist layer.

3. The method of claim 1, wherein the first mask is a hardmask formed from silicon nitride.

4. The method of claim 1, wherein providing a first mask comprises:
   providing a layer of hardmask outwardly from the layer of dielectric material; and
   forming the plurality of hole patterns in the layer of hardmask by etching the plurality of hole patterns into the layer of hardmask.

5. The method of claim 1, wherein the first mask comprises a first precision standard and the second mask comprises a second precision standard, the second precision standard less precise than the first precision standard.

6. The method of claim 1, and further comprising hardening the first layer after the act of providing the first mask and before the act of defining the at least one isolated hole pattern.

7. The method of claim 1, and further comprising removing the first mask and the second mask from the layer of dielectric material after the act of forming the plurality of densely populated holes and the at least one isolated hole.

8. The method of claim 1, wherein the first mask is the first photo-resist layer and the act of defining at least one isolated hole pattern in the first mask comprises defining the at least one isolated hole pattern using a second mask that is formed from a second photo-resistant layer.

9. The method of claim 1, wherein forming a plurality of densely populated holes by etching comprises chemically etching the layer of dielectric material.

10. A method of forming a semiconductor device, comprising:
    defining a densely populated plurality of feature patterns in a layer of photo-resist by exposing the layer of photo-resist to a dense mask pattern of light;
    forming an isolated feature pattern by exposing one or more of the defined densely populated plurality of feature patterns to light; and
    forming a plurality of densely populated features and at least one isolated feature by removing the exposed photo-resist and etching an underlying layer of material not covered by the unexposed photo-resist.

11. The method of claim 10, wherein the dense mask pattern of light is provided using a first mask, the first mask having a first precision standard, and the act of forming an isolated feature pattern comprises exposing the one or more of the defined densely populated plurality of feature patterns to light using a second mask having a second precision standard, the second precision standard less precise than the first precision standard.

12. The method of claim 10, wherein the underlying layer of material is a layer of metal.

13. The method of claim 10, wherein the underlying layer of material is a dielectric material.

14. The method of claim 10, wherein the feature is a gate.

15. The method of claim 10, wherein etching comprises chemically etching an underlying layer of material.

16. The method of claim 10, wherein the light is ultraviolet light.

17. A method of forming a semiconductor device, comprising:
    providing a first mask that defines a densely populated plurality of hole patterns in a photo-resist layer overlying a layer of dielectric material;
    hardening the photo-resist layer after providing the first mask;

defining at least one isolated hole pattern in the hardened photo-resist layer by forming an isolated hole pattern by covering one or more of the defined densely populated hole patterns using a second mask;

forming a plurality of densely populated holes in the dielectric material and at least one isolated hole by etching, according to one or more of the plurality of hole patterns that are not covered by the second mask, the layer of dielectric material; and removing the first mask and the second mask from the layer of dielectric material.

18. The method of claim 17, wherein the first mask has a first precision standard and the second mask has a second precision standard, the second precision standard less precise than the first precision standard.

19. The method of claim 17, wherein the dielectric material is a layer of oxide.

20. The method of claim 17, wherein the photo-resist layer comprises a first photo-resist layer, and the second mask is formed from a second photo-resist layer.

* * * * *